(12) United States Patent
Srinivasan et al.

(10) Patent No.: US 7,091,164 B2
(45) Date of Patent: *Aug. 15, 2006

(54) SLURRY FOR CHEMICAL MECHANICAL POLISHING SILICON DIOXIDE

(75) Inventors: Ramanathan Srinivasan, Penn Yan, NY (US); Suryadevara V. Babu, Potsdam, NY (US); William G. America, Hilton, NY (US); Yie-Shein Her, Canandaigua, NY (US)

(73) Assignees: Eastman Kodak Company, Rochester, NY (US); Ferro Corporation, Cleveland, OH (US); Clarkson University, Potsdam, NY (US)

( * ) Notice: Subject to any disclaimer, the term of this patent is extended or adjusted under 35 U.S.C. 154(b) by 360 days.

This patent is subject to a terminal disclaimer.

(21) Appl. No.: 10/617,510

(22) Filed: Jul. 11, 2003

(65) Prior Publication Data

US 2004/0051077 A1 Mar. 18, 2004

Related U.S. Application Data

(62) Division of application No. 10/192,471, filed on Jul. 10, 2002, now Pat. No. 6,627,107, which is a division of application No. 09/456,612, filed on Dec. 8, 1999, now Pat. No. 6,468,910.

(51) Int. Cl.
*C09K 13/00* (2006.01)

(52) U.S. Cl. ............ 510/175; 252/79.1; 438/692

(58) Field of Classification Search ............ None
See application file for complete search history.

(56) References Cited

U.S. PATENT DOCUMENTS

| | | | |
|---|---|---|---|
| 5,575,885 A | 11/1996 | Hirabayashi et al. .... | 156/626.1 |
| 5,733,819 A | 3/1998 | Kodama et al. ............ | 438/692 |
| 5,738,800 A | 4/1998 | Hosali et al. ............... | 216/99 |
| 5,759,917 A * | 6/1998 | Grover et al. .............. | 438/690 |
| 5,876,490 A | 3/1999 | Ronay ........................ | 106/3 |
| 6,027,554 A | 2/2000 | Kodama et al. ............ | 106/3 |
| 6,033,993 A * | 3/2000 | Love et al. ................. | 438/745 |
| 6,042,741 A | 3/2000 | Hosali et al. ............... | 252/79.1 |
| 6,132,637 A | 10/2000 | Hosali et al. ............... | 252/79.1 |
| 6,218,305 B1 | 4/2001 | Hosali et al. ............... | 438/691 |

(Continued)

FOREIGN PATENT DOCUMENTS

EP 0 659 858 A2 6/1995

(Continued)

OTHER PUBLICATIONS

*Chemical Mechanical Planarization of Microelectronic Materials*, "8.1.2 Shallow Trench Isolation"; by J. M. Steigerwald, S. P. Muraka, and R. J. Gutman; ISBN 0-471-13827-4 (Jon Wiley & Son, Inc. 1997), pp. 273-274.

(Continued)

*Primary Examiner*—Gregory Webb
(74) *Attorney, Agent, or Firm*—Peyton C. Watkins

(57) ABSTRACT

A new slurry for shallow trench isolation (STI) processing in the chemical mechanical planarization (CMP) in microelectronic industry comprising an aqueous medium having an abrasive; and a compound which has a carboxylic group and an electrophilic functional group. The combination of ceria and/or titania with amino acids to obtain polishing selectivity's greater than 5:1. CMP is used for removing the excess oxide and planarizing the substrate and the trench. The silicon nitride acts as a stop layer, preventing the polishing of underlying silicon substrate.

6 Claims, 4 Drawing Sheets

U.S. PATENT DOCUMENTS

| | | | |
|---|---|---|---|
| 6,299,659 B1 | 10/2001 | Kido et al. | 51/309 |
| 6,410,444 B1 | 6/2002 | Kido et al. | 438/693 |
| 6,436,835 B1 | 8/2002 | Kido et al. | 438/693 |
| 6,491,843 B1 * | 12/2002 | Srinivasan et al. | 252/79.1 |
| 6,627,107 B1 * | 9/2003 | Srinivasan et al. | 252/79.1 |
| 6,689,692 B1 * | 2/2004 | Grover et al. | 438/691 |

FOREIGN PATENT DOCUMENTS

| | | |
|---|---|---|
| EP | 0 786 504 A2 | 7/1997 |
| EP | 0 846 740 A1 | 6/1998 |
| EP | 0 853 335 A2 | 7/1998 |
| EP | 1 061 111 A1 | 12/2000 |
| WO | WO99/43761 | 9/1999 |
| WO | WO 99/53532 | 10/1999 |

OTHER PUBLICATIONS

*A High Oxide:Nitride Selectivity CMP Slurry For Shallow Trench Isolation*; by Sharath Hosali and Ray Lavoie; Electrochemical Society Proceedings, vol. 98-7, pp. 218-234.

*Application of Ceria-Based High Selectivity Slurry to STI CMP for Sub 0.18 μm CMOS Technologies*; by Ki-Sik Choi, Sang-Ick Lee, Chang-Il Kim, Chul-Woo Nam, Sam-Dong Kim, and Chung-Tae Kim; CMP-MIC Conference, Feb. 11-12, 1999, pp. 307-313.

*A Production-Proven Shallow Trench Isolation (STI) Solution Using Novel CMP Concepts*; by Raymond R. Jin, Jeffery David, Bob Abbassi, Tom Osterheld, and Fritz Redeker; CMP-MIC Conference, Feb. 11-12, 1999, pp. 314-321.

*A Wide Margin CMP and Clean Process For Shallow Trench Isolation Applications*; by Brad Withers, Eugene Zhao, Rahul Jairath; CMP-MIC Conference, Feb. 19-20, 1998, pp. 319-327.

*Planarization Process and Consumable Development For Shallow Trench Isolation*; by Sharath D. Hosali, et al.; CMP-MIC Conference, Feb. 13-14, 1997, pp. 52-57.

*Pattern Dependence And Planarization Using Silica Or Ceria Slurries For Shallow Trench Isolation*; by D. R. Evans, et al.; CMP-MIC Conference, Feb. 19-20, 1998, pp. 347-350.

*A Two-Step CMP-RIE Planarization Sequence For Advanced Trench Isolation Process*; by Konstantin Smekalin; CMP-MIC Conference, Feb. 13-14, 1997, pp. 21-28.

*Raising Oxide:Nitride Selectivity To Aid In The CMP Of Shallow Trench Isolation Type Applications*; by C.R. Mills, et al.; CMP-MIC Conference, Feb. 13-14, 1997, pp. 179-185.

\* cited by examiner

SLURRY FOR CHEMICAL MECHANICAL POLISHING SILICON DIOXIDE

CROSS-REFERENCE TO RELATED APPLICATIONS

This is a division of application Ser. No. 10/192,471, filed Jul. 10, 2002 now U.S. Pat. No. 6,627,107, which is a division of application Ser. No. 09/456,612, filed Dec. 8, 1999, now U.S. Pat. No. 6,468,910.

FIELD OF THE INVENTION

The present invention relates to selective slurries used for Chemical Mechanical Polishing (CMP) of Silicon Dioxide, and more specifically to a chemical mechanical polishing composition comprising an abrasive, an aqueous medium and a compound which has a carboxylic acid group and an electrophilic functional group, for selectively polishing silicon dioxide in preference to silicon nitride.

BACKGROUND OF THE INVENTION

There are numerous references within the prior art for the removal of dielectric films, silicon dioxide, silicon nitride by Chemical-Mechanical Polishing (CMP) regulated and moderated by the interaction of abrasive particulate within a slurry. Changes in the slurry solution properties have a profound effect on the polishing chemistry and relative removal rates of dielectric films. Common slurry solution properties include pH, temperature, slurry particle composition, its size and shape, degree of agglomeration, and slurry weight percent. While the slurry vendor has control over most slurry properties, the pH and temperature can be controlled during the polishing process and can have a strong influence on CMP results.

CMP relies on mechanical means with chemical activity to remove and ultimately planarize the top film or films on wafers during semiconductor processing. The mechanical action during CMP, including table speed, applied force, pad hardness, etc., are typically used to control rate, planarity, and uniformity. The chemical portion of CMP is usually exploited to achieve selectivity and help deal with issues of pattern dependence such as erosion and dishing. Silica slurries are typically prepared with pH greater than 8, while ceria slurries have pH ranging from 4 to 10. In both cases the pH of the suspension can have a strong effect on polish rate and selectivity. Knowing the effect of pH on rate and film selectivity can be used to help understand and control the CMP process and achieve the desired result.

A study of the pertinent prior art references indicates that there are a few compositions of CMP slurries which provide a fairly high oxide to nitride removal rate selectivity. Those that are known are summarized below, but none of these prior art references have the composition or the wide working range of pH.

Conventional CMP slurries used for polishing oxides typically comprise of an abrasive in alkaline medium (high pH). They polish both oxide and nitride at substantial rates with a selectivity of about 10 or below. Hence new slurries which can provide a very high oxide to nitride selectivity are needed to overcome the problem of polishing nitride and the underlying silicon substrate.

There are a number of prior art patent references for slurries used in CMP: (1) U.S. Pat. No. 5,738,800 issued in April 1998 to Hosali, et al.; (2) U.S. Pat. No. 5,759,917 issued in June 1998 to Grover et al.; (3) EP 0 786 504 A2 published in July 1997 by Kodama et al.; (4) EP 0 846 740 A1 published in June 1998 by Ronay; and (5) EP 0 853 335 A2 published in July 1998 by Morrison et al.

Additional prior art references in the form of technical publications that are related to the present invention are summarized below.

*Chemical Mechanical Planarization of Microelectronic Materials;* "8.1.2 Shallow Trench Isolation", by J. M. Steigerwald, S. P. Muraka, and R. J. Gutman; ISBN 0-471-13827-4 (Jon Wiley & Son, Inc.1997), pages 273–274. This reference gives a general discussion of the desirability of using Shallow Trench Isolation in place of Local Oxidation of Silicon (LOCOS). While this reference teaches that conventional CMP processes have low selectivity between oxides and nitrides, no insight into a potential correction for this problem is taught.

*A High Oxide:Nitride Selectivity CMP Slurry for Shallow Trench Isolation;* by Sharath Hosali and Ray Lavoie; in Electrochemical Society Proceedings, Volume 98-7, pages 218–234. This reference teaches a slurry that enhances the selectivity rate between silicon oxide and silicon nitride. The slurry taught has cerium oxide as an abrasive with a proprietary solution that inhibits the removal rate of the silicon nitride. The results of this prior art references indicate a high rate of selectivity for unpatterned wafers, however, the selectivity for patterned wafers is almost the same as with the conventional slurry that it was compared against.

*Application Of Ceria-Based High Selectivity Slurry to STI CMP For Sub 0.18 μm CMOS Technologies;* by Ki-Sik Choi, Sang-Ick Lee, Chang-Il Kim, Chul-Woo Nam, Sam-Dong Kim, and Chung-Tae Kim; CMP-MIC Conference, Feb. 11–12, 1999. This paper teaches the use of a ceria based slurry for CMP purposes in a STI setting. While, the slurry discussed may have been selective, there is no teaching related to the manufacturing of the slurry. Moreover, in order to prevent dishing from the CMP process, dummy patterns are required. Also, there are some problems related to scratches from the ceria abrasive which require filtering to correct.

*A Production-Proven Shallow Trench Isolation (STI) Solution Using Novel CMP Concepts;* by Raymond R. Jin, Jeffery David, Bob Abbassi, Tom Osterheld, and Fritz Redeker; in CMP-MIC Conference on Feb. 11–12, 1999. This reference discusses the previously discussed problem of having to use dummy patterns to reduce dishing. The solution offered by this prior art reference is to employ a low selectivity, or no selectivity, slurry for minimizing dishing during over polishing in combination with special system apparatus and polishing heads.

*A Wide Margin CMP And Clean Process For Shallow Trench Isolation Applications;* by Brad Withers, Eugene Zhao, Rahul Jairath; in CMP-MIC Conference on Feb. 11–12, 1998, pages 319–327. This reference addresses the problems of process cost and complexity due to the need for block masks, pattern resist etch, high selectivity material overlayers or implementation of dummy active areas.

It should be readily apparent from the foregoing discussion that there remains a need within the art for a method of chemical mechanical polishing and a slurry for that purpose that is selective and has the wide working range of pH of the present invention.

SUMMARY OF THE INVENTION

The present invention relates to a new slurry for shallow trench isolation (STI) processing as used in chemical mechanical planarization (CMP) within the microelectronic industry. In particular, the invention is a CMP slurry comprising of an abrasive, an aqueous medium and a compound which has a carboxylic group and an electrophilic functional group.

In the manufacturing of integrated circuits, the various devices in a layer must be isolated from one another. This can be accomplished by STI, among other methods. Compared to other methods, STI has the advantage of providing higher packing density for the devices. In the STI process, silicon dioxide is used as the isolating material. A layer of silicon nitride is deposited on silicon and a shallow trench is etched into the substrate using photolithography masks. Silicon dioxide is then deposited into the trench and over the nitride layer. The excess oxide on the top of nitride must be removed and the trench planarized in order to prepare for the next step which is usually the growth of gate oxide and deposition of poly silicon gate.

CMP is used for removing the excess oxide and planarizing the substrate and the trench. The silicon nitride acts as a stop layer, preventing the polishing of underlying silicon substrate. In order to achieve adequate planarization and minimal overpolishing, the slurry used for CMP must have a high oxide to nitride removal rate ratio. This and other objectives are satisfied by the present invention in providing a slurry for chemical mechanical polishing comprising an aqueous medium with abrasive particles, and a compound which has a carboxylic acid group and an electrophilic functional group, for selectively polishing silicon dioxide in preference to silicon nitride; and applying the slurry at a polishing interface between a polishing pad and the composite comprised of silica and silicon nitride.

ADVANTAGES OVER PRIOR ART

The slurry provides high oxide:nitride removal rate selectivity over a wide range of pH (at least between pH of 6 and pH of 11). It is not necessary to have a surfactant in the slurry to obtain the high selectivity in the present invention. It provides a wide operating range giving numerous opportunities to optimize other parameters (like surface quality) without the loss of selectivity. Many of the compounds that are used as additives are environmentally benign thus minimizing the cost of waste water treatment.

DETAILED DESCRIPTION OF THE INVENTION

It has been discovered that a slurry for shallow trench isolation (STI) processing that can be used for chemical mechanical planarization (CMP) in the microelectronic industry to solve the prior art problem of polishing nitride and the underlying silicon substrate and yielding very high oxide to nitride selectivity. In particular, the invention is a CMP slurry comprising of an abrasive, an aqueous medium and a compound which has a carboxylic group and an electrophilic functional group.

In the manufacturing of integrated circuits, the various devices in a layer must be isolated from one another. This can be accomplished by an STI process, wherein silicon dioxide is used as the isolating material. A layer of silicon nitride is deposited on silicon and a shallow trench is etched into the substrate using photolithography masks. Silicon dioxide is then deposited into the trench and over the nitride layer. The excess oxide on the top of nitride must be removed and the trench planarized in order to prepare for the next step which is usually the growth of gate oxide and deposition of poly silicon gate.

Figure 1:
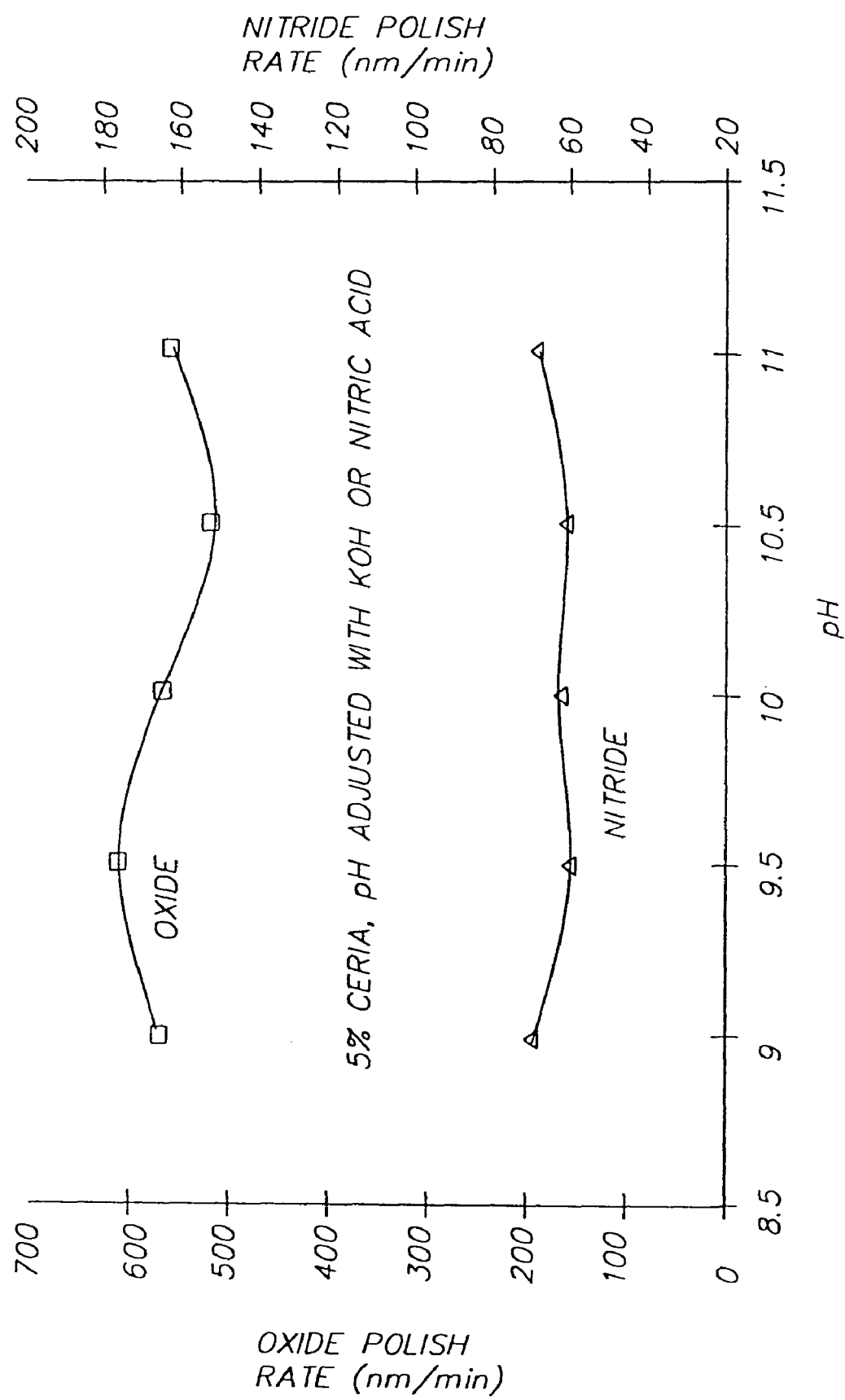
FIG. 1 is a graph illustrating the oxide and nitride removal rates of a low selectivity slurry.
Figure 2:
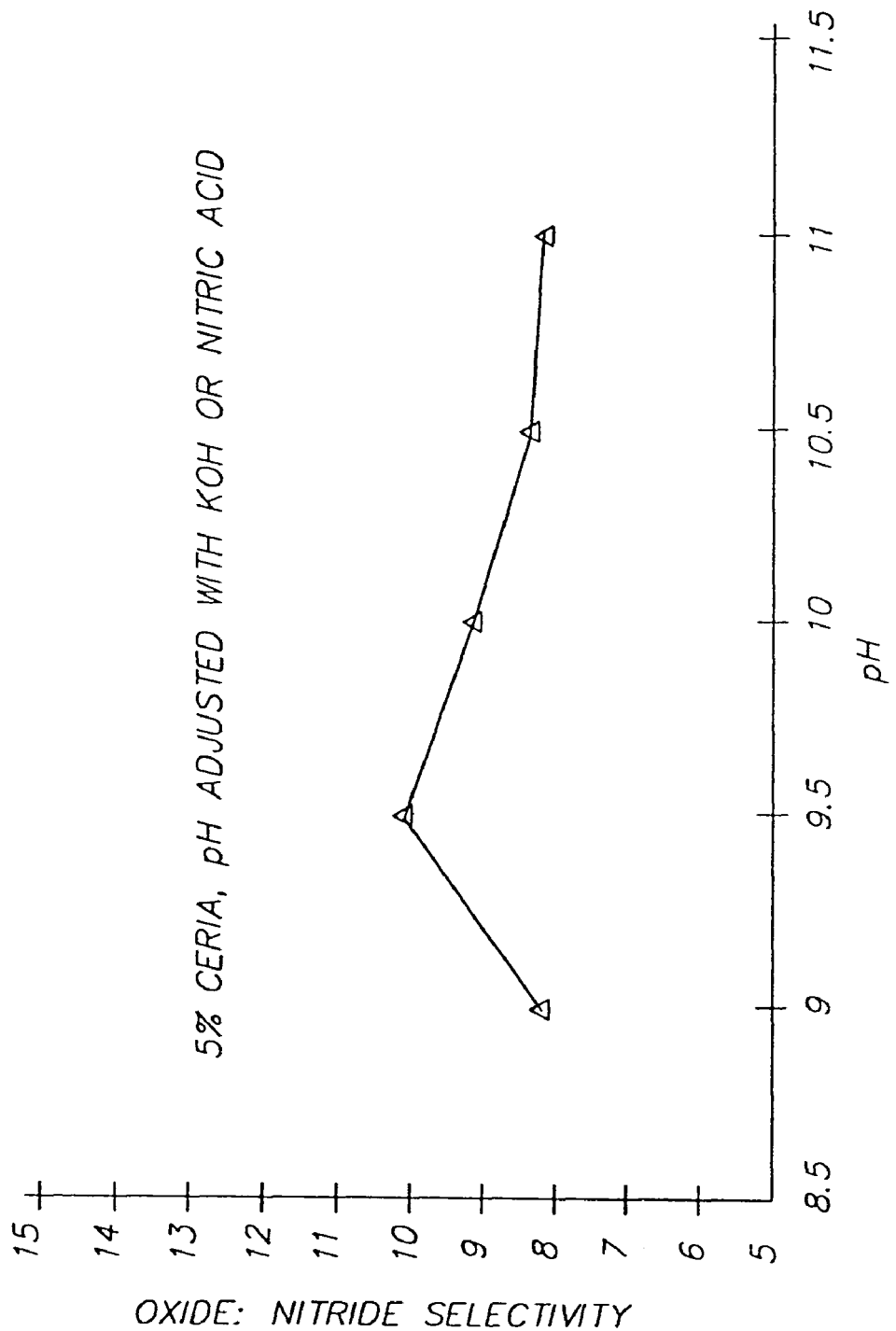
FIG. 2 is a graph illustrating oxide:nitride selectivity of a low selectivity slurry.

FIGS. 1 and 2 illustrate the results of a low selectivity slurry comprising 1% (by wt) ceria in water. The pH is adjusted with 40% (by wt) KOH. The polishing conditions are 5.6 psi down pressure, 30 rpm table speed, 30 rpm quill speed, 25° C. temperature and 240 cc/min slurry flow rate.

Figure 3:
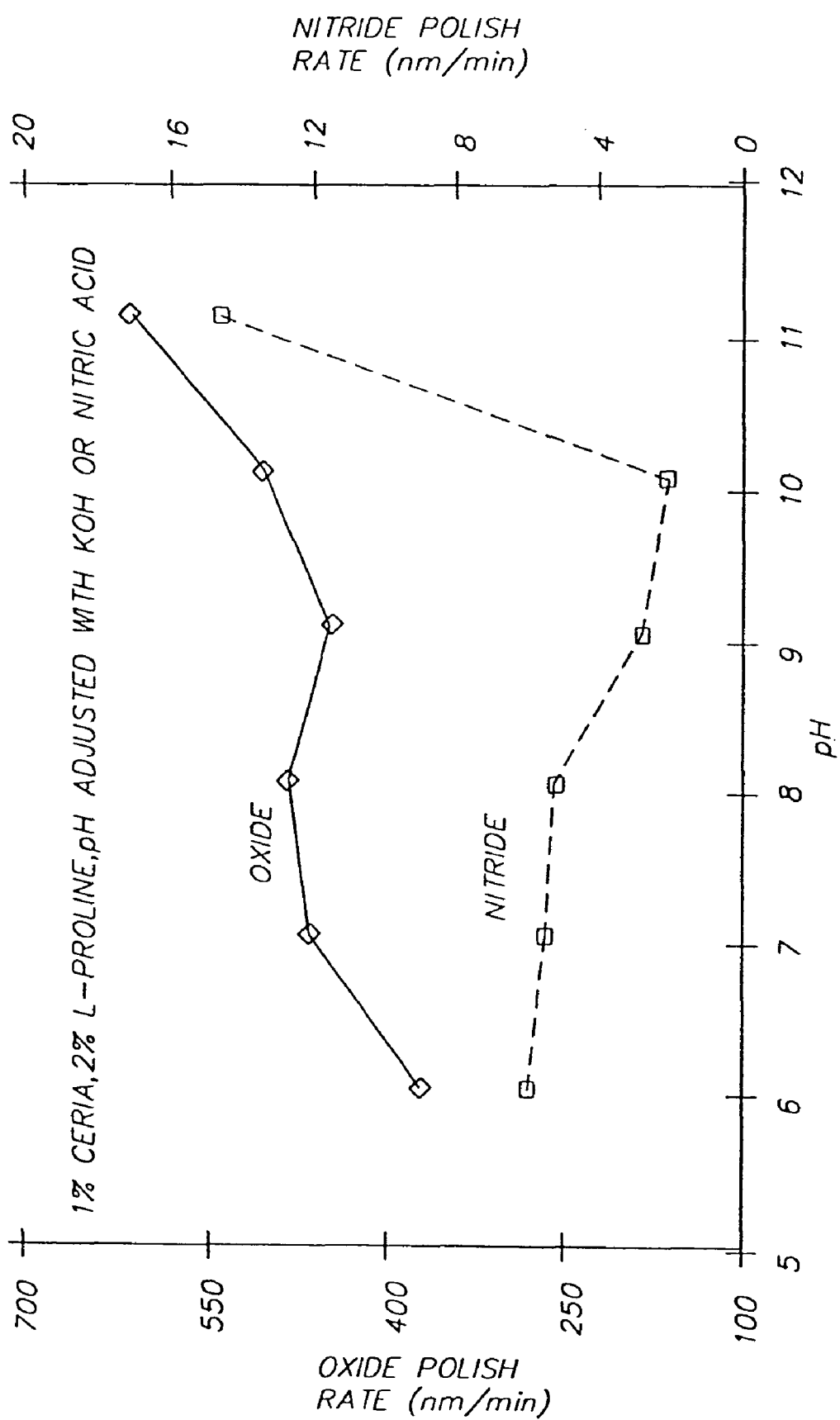
FIG. 3 is a graph illustrating the oxide and nitride removal rates of a high selectivity slurry.
Figure 4:
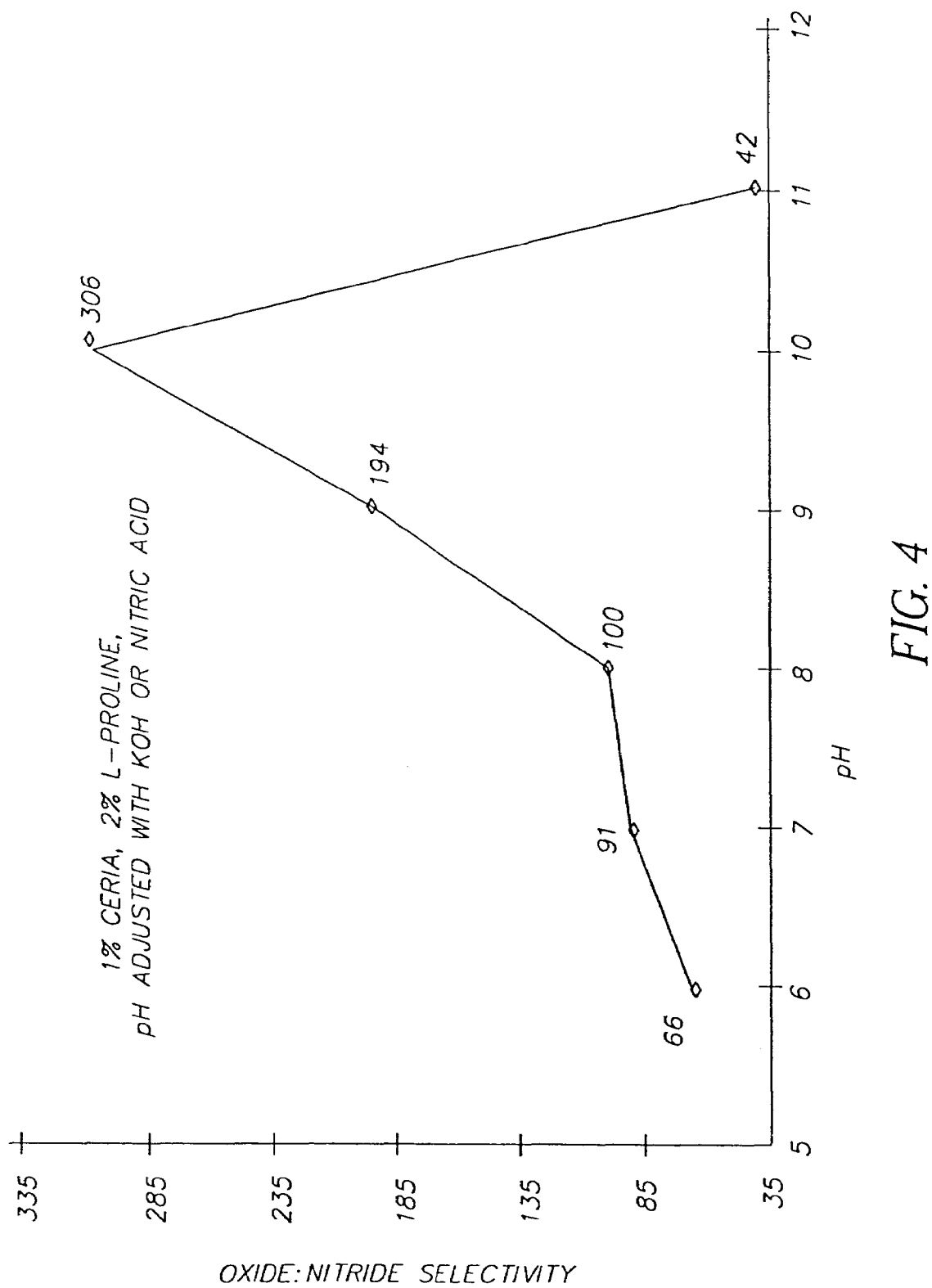
FIG. 4 is a graph illustrating oxide:nitride selectivity of a high selectivity slurry.

FIGS. 3 and 4 illustrate the results of a high selectivity slurry comprising 1% (by wt) ceria and 2% (by wt) L-Proline (additive) in water. The pH is adjusted with 40% (by wt) KOH or 1 N Nitric acid. The polishing conditions are 6 psi down pressure, 2 psi back pressure, 40 rpm table speed, 40 rpm quill speed, 20° C. temperature and 340 cc/min slurry flow rate. The results shown in FIGS. 3 and 4 clearly illustrate a dramatic improvement in selectivity as compared to that as shown in FIGS. 1 and 2.

It is clear that the presence of the additive, L-Proline, reduces the polish rate of nitride dramatically, yielding a very high selectivity in a wide range of pH.

Other additive with carboxylic groups and electrophilic functional group also were tested and the results are given in table 1. The slurries had 5% (by wt) ceria, given amount of the additive and the pH was adjusted to 10 with 40% (by wt) KOH or 30% Ammonia solution. Polishing conditions were 5.6 psi down pressure, 30 rpm table speed, 30 rpm quill speed, 25° C. and 240 cc/min slurry flow rate.

TABLE 1

| Additive concentration (by wt %) | Oxide polish rate (nm/min) | Nitride polish rate (nm/min) | Selectivity |
| --- | --- | --- | --- |
| 0 | 489 | 66 | <8 |
| 1% glycine | 547 | 34 | 16 |
| 1% L-alanine | 545 | 20 | 27 |
| 1% L-Proline | 487 | 12 | 41 |
| 4% L-Proline | 430 | 2 | 230 |

Titania particles were used as abrasive in the following slurry. The slurry had 5% (by wt) titania, given wt % of L-Proline and the pH was adjusted to 10 with 30% ammonia solution. The polishing conditions were 5.6 psi down pressure, 40 rpm table speed, 40 rpm quill speed, 25° C. and 240 cc/min slurry flow rate. The results are shown in table 2.

TABLE 2

| Additive concentration (by wt %) | Oxide polish rate (nm/min) | Nitride polish rate (nm/min) | Selectivity |
| --- | --- | --- | --- |
| 0 | 57 | 36 | <2 |
| 4% L-Proline | 73 | 1 | 73 |

Thus it is clear that while the presence of the additive is crucial to reduce the polish rate of the nitride, the additive is effective irrespective of the type of abrasive.

The slurry provides high oxide:nitride removal rate selectivity over a wide range of pH (at least between pH of 6 and pH of 11). Unlike U.S. Pat. No. 5,738,800, it is not necessary to have a surfactant in the slurry to obtain the high selectivity in the present invention. It is believed that the wide operating range will provide a lot of room to optimize other parameters (like surface quality) without the loss of selectivity. Many of the compounds that are used as additives are environmentally benign thus minimizing the cost of waste water treatment.

Permissible alternatives in the elements, materials, steps, arrangements, of the present invention including the broadest permissible range for conditions, and proportions follow. The additive has a carboxylic group and another functional group which is electophilic (i.e. attracts electrons). Examples of electrophilic groups include, but are not limited to, amine groups, chloride, hydroxyl group and carboxylic group. If the electrophilic group is in the alpha position (close to the carboxylic group) it is especially effective. Alpha amino acids are the preferred additives since they are cost effective and environmentally friendly.

The invention has been described in detail with particular reference to certain preferred embodiments thereof, but it will be understood that variations and modifications can be effected within the spirit and scope of the invention.

What is claimed is:

1. A slurry for use in removing silicon dioxide in preference to silicon nitride by chemical mechanical polishing in the shallow trench isolation process, the slurry comprising:
   an aqueous medium having abrasive particles dispersed therein and
   proline;
wherein the slurry has a pH within the range of from about 6 to about 11 and provides a silicon dioxide to silicon nitride removal rate selectivity of greater than 5:1.

2. The slurry according to claim 1 wherein the abrasive particles are selected from the group consisting of ceria and titania.

3. A slurry for use in removing silicon dioxide in preference to silicon nitride by chemical mechanical polishing in the shallow trench isolation process, the slurry comprising:
   an aqueous medium having abrasive particles dispersed therein; and
   glycine;
wherein the slurry has a pH within the range of from about 6 to about 11 and provides a silicon dioxide to silicon nitride removal rate selectivity of greater than 5:1.

4. The slurry according to claim 3 wherein the abrasive particles are selected from the group consisting of ceria and titania.

5. A slurry for use in removing silicon dioxide in preference to silicon nitride by chemical mechanical polishing in the shallow trench isolation process, the slurry comprising:
   an aqueous medium having abrasive particles dispersed therein; and
   alanine;
wherein the slurry has a pH within the range of from about 6 to about 11 and provides a silicon dioxide to silicon nitride removal rate selectivity of greater than 5:1.

6. The slurry according to claim 5 wherein the abrasive particles are selected from the group consisting of ceria and titania.

* * * * *